US00RE45981E

(19) United States
(12) Reissued Patent
Kawada

(10) Patent Number: US RE45,981 E
(45) Date of Reissued Patent: Apr. 19, 2016

(54) PIEZOELECTRIC CERAMIC COMPOSITION AND PIEZOELECTRIC CERAMIC ELECTRONIC COMPONENT

(71) Applicant: MURATA MANUFACTURING CO., LTD., Nagaokakyo-Shi (JP)

(72) Inventor: Shinichiro Kawada, Nagaokakyo (JP)

(73) Assignee: MURATA MANUFACTURING CO., LTD., Nagaokakyo-Shi, Kyoto-Fu (JP)

(21) Appl. No.: 14/104,812

(22) Filed: Dec. 12, 2013

Related U.S. Patent Documents

Reissue of:
(64) Patent No.: 8,076,828
Issued: Dec. 13, 2011
Appl. No.: 13/091,256
Filed: Apr. 21, 2011

U.S. Applications:
(63) Continuation of application No. PCT/JP2009/058486, filed on Apr. 30, 2009.

(30) Foreign Application Priority Data

Oct. 28, 2008 (JP) ..... 2008-276543

(51) Int. Cl.
*H01L 41/08* (2006.01)
*H01L 41/273* (2013.01)
(Continued)

(52) U.S. Cl.
CPC ..... *H01L 41/273* (2013.01); *C04B 35/495* (2013.01); *H01L 41/0471* (2013.01);
(Continued)

(58) Field of Classification Search
CPC ..... H01L 41/1871; H01L 41/1873; H01L 41/273; H01L 41/471; H01L 41/083; H01L 41/0477; C04B 35/495; C04B 2235/3203; C04B 2235/3208; C04B 2235/3213; C04B 2235/3215; C04B 2235/3224; C04B 2235/3225; C04B 2235/3227; C04B 2335/3248; C04B 2235/3251; C04B 2235/3262; C04B 2235/3286; C04B 2235/3293; C04B 2235/3294; C04B 2235/6065; C04B 2235/652; C04B 2235/768; C04B 2235/85; C04B 2235/3201
USPC ..... 310/358, 359, 328; 252/62.9 PZ
See application file for complete search history.

(56) References Cited

U.S. PATENT DOCUMENTS 6,083,415 A * 7/2000 Kimura et al. ..... 252/62.9 R
6,093,339 A 7/2000 Kimura et al.
(Continued)

FOREIGN PATENT DOCUMENTS

CN 101115694 A 1/2008
JP 11-228227 A 8/1999
(Continued)

OTHER PUBLICATIONS

Written Opinion of the International Searching Authority, mailed Aug. 25, 2009.

*Primary Examiner* — Minh T Nguyen
(74) *Attorney, Agent, or Firm* — Arent Fox LLP

(57) ABSTRACT

A piezoelectric ceramic includes a main constituent represented by the general formula $\{(1-x)(K_{1-a-b}Na_aLi_b)(Nb_{1-c}Ta_c)O_3\}-xM2M4O_3\}$, and as accessory constituents, $2\alpha$ mol of Na, $(\alpha+\beta)$ mole of an M4' element, and $\gamma$ mol of Mn with respect to 100 mol of the main constituent, where $0.1\leq\alpha\leq\beta$, $1\leq\alpha+\beta\leq10$, and $0\leq\gamma\leq10$, M2 is Ca, Ba, and/or Sr, the M4 element and the M4' element are Zr, Sn, and/or Hf, $0\leq x\leq0.06$, $0\leq a\leq0.9$, $0\leq b\leq0.1$, and $0\leq c\leq0.3$. Even in the case of using Ni as the main constituent in an internal electrode material of a piezoelectric element and carrying out co-firing, favorable piezoelectric properties can be obtained without defective polarization.

22 Claims, 3 Drawing Sheets

(51) Int. Cl.

| | |
|---|---|
| ***C04B 35/495*** | (2006.01) |
| ***H01L 41/047*** | (2006.01) |
| ***H01L 41/083*** | (2006.01) |
| ***H01L 41/187*** | (2006.01) |

(52) U.S. Cl.

CPC ..... *H01L41/083* (2013.01); *H01L 41/1873* (2013.01); *C04B 2235/3201* (2013.01); *C04B 2235/3203* (2013.01); *C04B 2235/3208* (2013.01); *C04B 2235/3213* (2013.01); *C04B 2235/3215* (2013.01); *C04B 2235/3224* (2013.01); *C04B 2235/3225* (2013.01); *C04B 2235/3227* (2013.01); *C04B 2235/3248* (2013.01); *C04B 2235/3251* (2013.01); *C04B 2235/3262* (2013.01); *C04B 2235/3286* (2013.01); *C04B 2235/3293* (2013.01); *C04B 2235/3294* (2013.01); *C04B 2235/6025* (2013.01); *C04B 2235/652* (2013.01); *C04B 2235/768* (2013.01); *C04B 2235/85* (2013.01); *H01L 41/0477* (2013.01)

(56) References Cited

U.S. PATENT DOCUMENTS

| | | | | |
|---|---|---|---|---|
| 7,691,286 | B2 | 4/2010 | Kawada et al. | |
| 7,754,095 | B2 | 7/2010 | Kawada et al. | |
| 7,910,016 | B2 | 3/2011 | Kawada et al. | |
| 8,316,519 | B2 | 11/2012 | Kimura et al. | |
| 8,354,038 | B2 | 1/2013 | Wang et al. | |
| 2007/0001553 | A1 | 1/2007 | Kawada et al. | |
| 2008/0001503 | A1 * | 1/2008 | Asano et al. | 310/366 |
| 2008/0061263 | A1 | 3/2008 | Kawada et al. | 252/62.9 PZ |
| 2008/0252179 | A1 | 10/2008 | Kimura et al. | |
| 2010/0083474 | A1 | 4/2010 | Kimura et al. | |
| 2010/0207494 | A1 | 8/2010 | Kawada et al. | |

FOREIGN PATENT DOCUMENTS

| | | | |
|---|---|---|---|
| JP | 11-228228 | A | 8/1999 |
| JP | 3945536 | B2 | 7/2007 |
| WO | WO2006/100807 | A1 * | 9/2006 |
| WO | WO2006/117952 | A1 * | 11/2006 |
| WO | WO-2006/117990 | A1 | 11/2006 |

* cited by examiner

PIEZOELECTRIC CERAMIC COMPOSITION AND PIEZOELECTRIC CERAMIC ELECTRONIC COMPONENT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This is a continuation of application Serial No. PCT/JP2009/058486, filed Aug. 30, 2009, the entire contents of which are incorporated herein by reference.

TECHNICAL FIELD

The present invention relates to a piezoelectric ceramic composition and a piezoelectric ceramic electronic component, and more particularly, relates to a lead-free piezoelectric ceramic composition, and a piezoelectric ceramic electronic component using the piezoelectric ceramic composition, such as a laminated piezoelectric actuator.

BACKGROUND ART

In recent years, demand has been increased for laminated piezoelectric ceramic electronic components such as laminated piezoelectric actuators, which are able to acquire a large amount of displacement even at low voltages.

This type of piezoelectric ceramic electronic component is typically manufactured in such a way that ceramic green sheets to serve as piezoelectric ceramic layers and conductive layers to serve as internal electrodes are stacked alternately and subjected to co-firing. Furthermore, Ni which is relatively easily available at a low price is preferably used as an internal electrode material.

Also, lead-free piezoelectric ceramic compositions containing no Pb have been attracting attention for environmental care, etc. in recent years. In particular, $KNbO_3$ based piezoelectric ceramic compositions with K located as a main constituent at the A site of a perovskite structure (general formula: $ABO_3$) and Nb located as a main constituent at the B site thereof have been researched and developed actively, because the $KnbO_3$ based piezoelectric ceramic compositions provide relatively high piezoelectric d constants (piezoelectric strain constants).

For example, Patent Document 1 discloses a piezoelectric ceramic composition which has a main constituent represented by the general formula $\{(1-x)(K_{1-a-b}Na_aLi_b)_m(Nb_{1-c-d}Ta_cSb_d)O_3-xM2_nM4O_3\}$. In this formula, M2 represents at least one bivalent metal element selected from among Ca, Sr, and Ba, and M4 represents at least one tetravalent metal element selected from among Ti, Zr, and Sn, x, a, b, c, d, m, and n respectively fall within the ranges of $0.005 \le x \le 0.1$, $0 \le a \le 0.9$, $0 \le b \le 0.3$, $0 \le a+b \le 0.9$, $0 \le c \le 0.5$, $0 \le d \le 0.1$, $0.9 \le m \le 1.1$, and $0.9 \le n \le 1.1$, and at least one specific element selected from among In, Sc, Y, Nd, Sm, Eu, Gd, Tb, Dy, Ho, Er, Yb, and Lu is contained in an amount of 0.1 to 10 mol in total with respect to 100 mol of the main constituent.

In Patent Document 1, the piezoelectric ceramic composition has compositional constituents as described above, and thus can be sintered stably in the atmosphere, thereby allowing for the achievement of piezoelectric ceramic electronic components which have a high relative dielectric constant and electromechanical coupling coefficient, and also have a high Curie point of Tc and a high piezoelectric d constant.

Patent Document 1: Japanese Patent No. 3945536

DISCLOSURE OF THE INVENTION

Problem to be Solved by the Invention

However, the piezoelectric ceramic composition in Patent Document 1 has the problems of defective polarization and a degraded piezoelectric property in the case of using Ni as the internal electrode material.

More specifically, when conductive layers containing Ni as their main constituent and the ceramic green sheets which have the compositional constituents described in Patent Document 1 are stacked alternately and subjected to co-firing, the Ni which constitutes the internal electrode material will diffuse to the ceramic green sheets during the firing, resulting in the segregation of the M4 element and the formation of a segregated phase such as Ni or Nb, and thereby leading to problems of defective polarization and degradation of the piezoelectric properties.

The present invention has been achieved in view of these circumstances, and an object of the present invention is to provide a piezoelectric ceramic composition which can provide a favorable piezoelectric property without causing defective polarization even in the case of using Ni for an internal electrode material and co-firing, and a piezoelectric ceramic electronic component using the piezoelectric ceramic composition, such as a laminated piezoelectric actuator.

Means for Solving the Problem

The present inventors have carried out earnest studies on monovalent and pentavalent—bivalent and tetravalent compositions represented by the general formula $\{(1-x)KnbO_3-xM2M4O_3\}$, in order to achieve the object mentioned above. Then, it has been found that when the same species of a tetravalent M4' element as the M4 present as an accessory constituent together with monovalent Na in the composition so as to be equivalent to the stoichiometric composition or more in terms of mol, it is possible to prevent the M4 element from being segregated and prevent a segregated phase such as Ni or Nb from being formed. In addition, it has been also found that the addition of a predetermined range of Mn to the composition can improve the sinterability in a reducing atmosphere without forming a segregated phase of Mn. These elements allow for the achievement of a piezoelectric ceramic composition which has a favorable piezoelectric property without causing defective polarization even in the case of co-firing with Ni.

The present invention has been achieved based on these findings, and a piezoelectric ceramic composition according to the present invention characteristically includes a main constituent represented by the general formula $\{(1-x)(K_{1-a-b}Na_aLi_b)(Nb_{1-c}Ta_c)O_3\}-xM2M4O_3\}$, M2 is at least one of Ca, Ba, and Sr, M4 is at least one of Zr, Sn, and Hf, and x, a, b, and c are respectively $0 \le x \le 0.06$, $0 \le a \le 0.9$, $0 \le b \le 0.1$, and $0 \le c \le 0.3$), and as accessory constituents, $2\alpha$ mol of Na, $(\alpha+\beta)$ mol of an M4' element (M4' represents at least one element of Zr, Sn, and Hf), and $\gamma$ mol of Mn with respect to 100 mol of the main constituent, wherein $\alpha$, $\beta$, and $\gamma$ respectively satisfy $0.1 \le \alpha \le \beta$, $1 \le \alpha+\beta 10$, and $0 \le \gamma \le 10$.

In addition, further earnest studies carried out by the present inventors have found that the ranges of $2 \le \gamma \le 10$ for $\gamma$ and $0.001 \le x \le 0.06$ for x can give a more favorable product yield.

More specifically, a feature of the piezoelectric ceramic composition according to the present invention is that $\gamma$ is $2 \leq \gamma \leq 10$.

Furthermore, a feature of the piezoelectric ceramic composition according to the present invention is that x is $0.001 \leq x \leq 0.06$.

In addition, the study results of the present inventors have found that the substitution of part of Nb with Sb in the range of 0.05 mol or less can ensure a favorable piezoelectric property, thereby providing a desired piezoelectric ceramic composition depending on the intended use.

More specifically, another feature of the piezoelectric ceramic composition according to the present invention is that part of Nb contained in the main constituent is substituted with Sb in the range of 0.05 mol or less.

Furthermore, further earnest studies of the present inventors have found that a predetermined amount of specific rare earth element M3 contained can make a further improvement in sinterability, and thus provide a piezoelectric ceramic composition which can prevent a piezoelectric ceramic electronic component from being strained.

More specifically, another feature of the piezoelectric ceramic composition according to the present invention is that at least one specific rare earth element selected from the group of Sc, In, Yb, Y, Nd, Eu, Gd, Dy, Sm, Ho, Er, Tb, Lu, La, and Pr is contained in the range of 5.0 mol or less with respect to 100 mol of the main constituent.

Furthermore, another feature of the piezoelectric ceramic composition according to the present invention is that at least 0.1 mol of the specific rare earth element is contained with respect to 100 mol of the main constituent.

In addition, a piezoelectric ceramic electronic component according to the present invention include a piezoelectric ceramic body with internal electrodes and piezoelectric ceramic layers stacked alternately and sintered; and external electrodes formed on the surface of the piezoelectric ceramic body, wherein the piezoelectric ceramic layers are formed from the piezoelectric ceramic composition.

In addition, another feature of the piezoelectric ceramic electronic component according to the present invention is that the internal electrodes contain Ni as their main constituent.

Advantages of the Invention

The piezoelectric ceramic composition according to the present invention can prevent the M4 element from being segregated, and prevent a segregated phase such as Ni or Nb from being formed, even in the case of co-firing with the internal electrode material containing Ni as its main constituent. Furthermore, the presence of Mn even allows for the achievement of a piezoelectric ceramic composition which has a favorable piezoelectric property without forming a segregated phase of Mn, and thus, without causing defective polarization.

In addition, the substitution of part of Nb contained in the main constituent with Sb in the range of 0.05 mol or less thus allows for the achievement of a piezoelectric ceramic composition which has favorable piezoelectric properties for its intended uses.

Further, the presence of the specific rare earth element contained in the range of 0.1 mol to 5.0 mol with respect to 100 mol of the main constituent thus causes no warpage even after sintering, thereby allowing for the achievement of a piezoelectric ceramic composition with favorable sinterability, in addition to the advantageous effect described above.

In addition, the piezoelectric ceramic electronic component according to the present invention includes a piezoelectric ceramic body with internal electrodes and piezoelectric ceramic layers stacked alternately and sintered; and external electrodes formed on the surface of the piezoelectric ceramic body, where the piezoelectric ceramic layers are formed from the piezoelectric ceramic composition in the piezoelectric ceramic electronic component. Thus, sintering can be completed even in the case of using a material containing Ni as its main constituent as an internal electrode material, and a low-cost and highly-practical piezoelectric ceramic electronic component can be obtained which has an excellent piezoelectric property, without causing defective polarization.

BEST MODE FOR CARRYING OUT THE INVENTION

Figure 1:
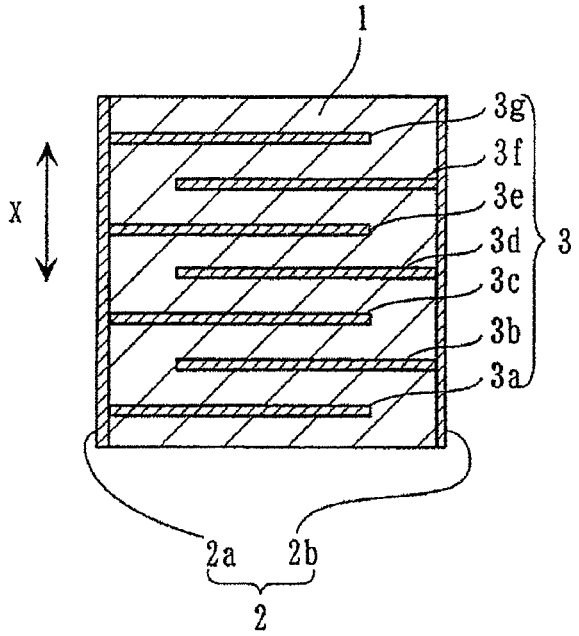
FIG. 1 is a cross-sectional view illustrating an embodiment of a laminated piezoelectric actuator as a piezoelectric ceramic electronic component according to the present invention.

Next, embodiments of the present invention will be described in detail.

A piezoelectric ceramic composition as an embodiment of the present invention is represented by the following general formula (A).

$$100\{(1-x)(K_{1-a-b}Na_aLi_b)(Nb_{1-c}Ta_c)O_3-xM2M4O_3\}+2\alpha Na+(\alpha+\beta)M4'+\gamma Mn \quad (A)$$

In the formula, M2 represents at least one element selected from Ca, Ba, and Sr with a valence of 2, and M4 and M4' each represent at least one element selected from Zr, Sn, and Hf with a valence of 4.

In addition, x, a, b, c, $\alpha$, $\beta$, and $\gamma$ satisfy the following mathematical formulas (1) to (7):

$$0 \leq x \leq 0.06 \quad (1)$$

$$0 \leq a \leq 0.9 \quad (2)$$

$$0 \leq b \leq 0.1 \quad (3)$$

$$0 \leq c \leq 0.3 \quad (4)$$

$$0.1 \leq \alpha \leq \beta \quad (5)$$

$$1 \leq \alpha+\beta \leq 10 \quad (6)$$

$$0 \leq \gamma \leq 10 \quad (7)$$

More specifically, the piezoelectric ceramic composition contains Na, an M4' element and Mn so as to satisfy the mathematical formulas (5) to (7) with respect to 100 mol of a main constituent represented by the following general formula (B). This composition does not exhibit defective polarization even in the case of using, as the internal electrodes, a conductive material containing Ni as its main constituent, thus allowing a piezoelectric ceramic composition which has a favorable piezoelectric property.

$$(1-x)(K_{1-a-b}Na_aLi_b)(Nb_{1-c}Ta_c)O_3-xM2M4O_3 \quad (B)$$

When conductive layers containing Ni as their main constituent and ceramic green sheets which have the composition represented by the general formula (B) are stacked alternately and subjected to co-firing, Ni in the conductive layers will diffuse to the ceramic green sheets, resulting in the segregation of the M4 element and the formation of a segregated phase such as Ni or Nb in the ceramic sintered body after firing, which thereby leads to defective polarization and degradation of the piezoelectric properties.

However, study results of the present inventors have found that when Na and the same species of the specified M4' element as the M4 element are blended so that the perovskite structure has an excessive amount of B site relative to the stoichiometric composition as a whole, the formation of the segregated phase can be reduced, thereby preventing defective polarization and degradation of piezoelectric properties.

More specifically, when the main constituent raw materials mixed with Na and the M4' element are subjected to firing, $Na_2M4'O_3$ is generated in the process of the firing. Then, this $Na_2M4'O_3$ reacts with the M4' element, Ni, etc. which are present in excess, to produce a perovskite-type composite oxide, $2NaM4'O_{2.5}$ as a solid solution in the main constituent. This solid solution of $2NaM4'O_{2.5}$ in the main constituent allows the formation of a segregated phase to be reduced.

In addition, when the molar quantity β of the M4' element is greater than the molar quantity a consumed in the reaction with Na with respect to the total content molar quantity (α+β) of the M4' element, K can be prevented from being segregated at crystal grain boundaries.

More specifically, Na and the M4' element react during the process of the firing to produce $Na_2M4'O_3$ as a solid solution in the main constituent as described above, and in this case, it is supposed that most of Na is present as a solid solution at the A site, whereas most of M4' is present as a solid solution at the B site. Thus, the part α of the molar quantity of the M4' element is greater than the part β of the molar quantity thereof and results in considerable $Na_2M4'O_3$ be generated, and causes an excessive amount of Na ions to be present as a solid solution at the A site. For this reason, there is a possibility that K ions, which have a larger in ion radius than Na ions, will be segregated as a segregated phase at the crystal grain boundaries, and thereby cause defective polarization and degradation of the piezoelectric properties.

From the viewpoint of prevention of segregation of K at crystal grain boundaries, the partial content molar quantity β of the M4' element is therefore required to be at least equivalent to the partial content molar quantity α.

It is to be noted that the crystalline microstructure of the piezoelectric ceramic composition is not particularly limited as long as the general formula (A) satisfies the mathematical formulas (1) to (7). For example, part of Na or the M4' element added as an accessory constituent may be present as a solid solution at the A site, whereas the rest may be present as a solid solution at the B site. Furthermore, part of the accessory constituent may be present as a solid solution in the main constituent, whereas the rest may be present at crystal grain boundaries or crystal triple points.

The M4 element and the M4' element may be any of Zr, Sn, and Hf. The M4 element and the M4' element may be composed of the same element, or may be formed from different species of these elements. For example, the M4 element and the M4' element may be respectively composed of Zr and Sn, or the M4 element and the M4' element may be both composed of Zr.

Next, the reasons why the x, a, b, c, α, and β are limited as in the mathematical formulas (1) to (7) will be described.

(1) x

The $KNbO_3$ based composition may have $M2M4O_3$ present therein as a solid solution to thereby allow for the achievement of a favorable piezoelectric property based on the intended use. However, if the $M2M4O_3$ in the main constituent has a solid solubility molar ratio x of greater than 0.06, there is a possibility that the excessive solid solubility amount of $M2M4O_3$ will degrade the piezoelectric property, and lead to a decrease in Curie point Tc.

Thus, the amounts of the $KNbO_3$ based compound and $M2M4O_3$ in the present embodiment are adjusted so that the solid solution molar ratio x is $0 \le x \le 0.06$.

It is to be noted that if the solid solution molar ratio x of $M2M4O_3$ is less than 0.001, there is a possibility that defectives without a desired piezoelectric property can be easily formed and lead to a decrease in product yield.

Therefore, the solid solution molar ratio x of $M2M4O_3$ in the main constituent is preferably $0.001 \le x \le 0.06$ in view of product yield considerations.

(2) a, b

Part of K in the $KNbO_3$ based composition is also preferably substituted with other alkali metals such as Na and Li, if necessary. However, when the substitution molar amount a of Na greater than 0.9 or the substitution molar amount b of Li greater than 0.1, there is possibility that degradation of the piezoelectric properties will be caused.

Thus, the amounts of the compositional constituents in the present embodiment are adjusted so that the molar amounts a and b are $0 \le a \le 0.9$ and $0 \le b \le 0.1$.

(3) c

Part of Nb in the $KNbO_3$ based compound is also preferably substituted with Ta, if necessary. However, there is a possibility that a substitution molar amount a of Ta greater than 0.3 will lead to degradation of the piezoelectric property, and lead to a decrease in Curie point Tc.

Thus, the amounts of the compositional constituents in the present embodiment are adjusted so that the molar amount c is $0 \le c \le 0.3$.

(4) α, β

As described above, the combined Na and M4' amount is such that the perovskite structure has a somewhat excessive amount of B site relative to the stoichiometric composition as a whole, which can reduce the formation of a segregated phase, and it is thereby possible to suppress defective polarization and piezoelectric property degradation.

However, if the molar quantity α of the M4' element totally consumed in the reaction with Na is less than 0.1 mol with respect to 100 mol of the main constituent, the amount of $Na_2M4'O_3$ produced in the process of the firing will be reduced, thereby failing to fully produce the desired effect, and failing to fully reduce the segregated phase described above.

If the total content molar quantity (α+β) of the M4' element is less than 1 mol with respect to 100 mol of the main constituent, the small total content molar quantity (α+β) fails to fully produce the desired effect, and thus fails to fully reduce the segregated phase described above.

On the other hand, there is a possibility of degradation of a piezoelectric property if the total content molar quantity (α+β) of the M4' element is excessively greater than 10 mol with respect to 100 mol of the main constituent.

In addition, if the unreacted molar quantity β of the M4' element is less than the reacted molar quantity α as described above, a segregated phase of K is unfavorably formed.

Thus, Na and the M4' element are present in the present embodiment so that the content molar quantity 2α of Na, the partial content molar quantities α, β of the M4' element, and the total content molar quantity (α+β) of M4' satisfy $0.1 \leq \alpha \leq \beta$ and $1 \leq \alpha+\beta \leq 10$ with respect to 100 mol of the main constituent.

(5) γ

Mn can be contained in the piezoelectric ceramic composition to allow the sinterability in a reducing atmosphere to be improved. However, if the content molar quantity γ of Mn is excessively greater than 10 mol with respect to 100 mol of the main constituent, there is a possibility that a segregated phase of Mn will be formed and lead to defective polarization and piezoelectric property degradation.

In the present embodiment, therefore the additive amount of Mn is adjusted so that the content molar quantity γ is $0 \leq \gamma \leq 10$ with respect to 100 mol of the main constituent.

It is to be noted that when the content molar quantity γ of Mn is less than 2 mol with respect to 100 mol of the main constituent, there is a possibility that defectives without the desired piezoelectric property will be easily formed and lead to a decrease in product yield.

In view of product yield, therefore, the content molar quantity γ of Mn with respect to 100 mol of the main constituent is preferably $2 \leq \gamma \leq 10$.

In the present embodiment, the compositional constituents were prepared so that the general formula (A) satisfies the mathematical formulas (1) to (7), as described above. Thus, even when a conductive material containing Ni as its main constituent is used for the internal electrode material and subjected to co-firing, segregation of the M4 element is so reduced that the formation of a segregated phase such as Ni or Nb is reduced. Furthermore, no segregated phase of Mn will be formed, and accordingly, a desired piezoelectric ceramic composition can be obtained which suppresses defective polarization or piezoelectric property degradation.

It is also preferable in the present invention to add at least one trivalent specific rare earth element M3 (M3 element) selected from the group of Sc, In, Yb, Y, Nd, Eu, Gd, Dy, Sm, Ho, Er, Tb, Lu, La, and Pr, if necessary.

In this case, the piezoelectric ceramic composition is represented by the following general formula (C).

$$100\{(1-x)(K_{1-a-b}Na_aLi_b)(Nb_{1-c}Ta_c)O_3-xM2M4O_3\}+2\alpha Na+(\alpha+\beta)M4'+\gamma Mn+\delta M3 \quad (C)$$

These M3 elements are present as donors in a solid solution at the A site of the perovskite structure, and thus believed to have the function of promoting the solid solubility of Mn and the M4 element and the M4' element acting as acceptors at the B site into crystal grains and keeping Mn and the M4 element and the M4' element in the crystal grains stably. Therefore, the sinterability in a reducing atmosphere is further stabilized to allow the ceramic sintered body to resist warpage, and make it possible to contribute to the improvement in piezoelectric property.

When adding the M3 element, the content molar quantity δ thereof is preferably 5.0 mol or less with respect to 100 mol of the main constituent. This is because if the content of the M3 element is greater than 5.0 mol with respect to 100 mol of the main constituent, there is a possibility of causing defective sintering to decrease the insulation resistance and thus lead to defective polarization.

In order to fully produce the effect of preventing the ceramic sintered body from warpage, the content molar quantity δ of the M3 element is preferably made at least 0.1 mol with respect to 100 mol of the main constituent.

It is to be noted that of the M3 elements, Sc, In, and La have a tendency to be slightly inferior in sinterability, and it is thus more preferable to use at least one selected from the group of Yb, Y, Nd, Eu, Gd, Dy, Sm, Ho, Er, Tb, Lu, and Pr, excluding Sc, In, and La.

Furthermore, part of Nb in the present invention in the main constituent is preferably substituted with Sb, if necessary, and this substitution can provide a piezoelectric ceramic composition with a desired piezoelectric property.

In this case, the piezoelectric ceramic composition is represented by the following general formula (D).

$$100\{(1-x)(K_{1-a-b}Na_aLi_b)(Nb_{1-c-d}Ta_cSb_d)O_3-xM2M4O_3\}+2\alpha Na+(\alpha+\beta)M4'+\gamma Mn+\delta M3 \quad (D)$$

*In general formula (D), x represents the molar amount of $M2M4O_3$, and a and b are the amount of Na and Li, respectively, in the alkali metal content in $(K_{1-a-b}Na_aLi_b)$. The number of mols of $(K_{1-a-b}Na_aLi_b)$ in $(K_{1-a-b}Na_aLi_b)(Nb_{1-c-d}Ta_cSb_d)$ is the same as that of $(Nb_{1-c-d}Ta_cSb_d)$, and the number of mols of $M2M4O_3$ is the same as that of M4.*

*Since Na and M4 (having the same elements as M4') are present in the accessory constituents, the content of these should not be included in x. The substitutions described in the preceding paragraph results in $\{(1-x)(K_{1-a-b}Na_aLi_b)(Nb_{1-c-d}Ta_cSb_d)O_3\}-xM2M4O_3\}$ to $(1-x)(Nb_{1-c-d}Ta_cSb_d)-xM2$. Accordingly, $x=M2/(Nb_{1-c-d}Ta_cSb_d)$. Rewriting this equation using Σ( . . . ) to indicate the total of the moles of the elements within the brackets results in $x=\Sigma(Ca,Ba,Sr)/(\Sigma(Nb,Ta,Sb,Ca,Ba,Sr)$.*

*The amount of K and the amount of Li (i.e., b) in the alkali metal content of $(K_{1-a-b}Na_aLi_b)(Nb_{1-c-d}Ta_cSb_d)$ would be their individual amounts divided by the total amount of Nb, Ta and Sb as in the last paragraph (in order to avoid including the accessory content of Na). Rewriting b using Σ( . . . ) results in $b=\Sigma(Li)/\Sigma(Nb,Ta,Sb)$.*

*The molar amount of Na in the alkali metal content (i.e., a) is determined by subtracting the amounts of K and Li from 1 in order to avoid including the amount of Na in the accessory material. Rewriting $1-(K+Li)$ using Σ( . . . ) results in $a=1-(\Sigma(Li)/(\Sigma(Nb,Ta,Sb)-(\Sigma(K)/(\Sigma(Nb,Ta,Sb))$.*

*In general formula (D), c is the amount of Ta and d is the amount of Sb in $(Nb_{1-c-d}Ta_cSb_d)$. Therefore $c=Ta/Nb+Ta+Sb$ and $d=Sb/Nb+Ta+Sb$. Rewriting using Σ( . . . ) to indicate the total moles of the elements within the brackets results in $c=\Sigma(Ta)/\Sigma(Nb,Ta,Sb)$, and $d=\Sigma(Sb)/\Sigma(Nb,Ta,Sb)$.*

*General formula (D) shows that the accessory constituents contain 2α mols of Na, α+β mols of M4', γ mols of Mn and δ mols of M3 with respect to 100 moles of the main constituent.*

*As discussed above, the main constituent can be simplified to $(1-x)(Nb_{1-c-d}Ta_cSb_d)-xM2$, so that 100 mols of the main constituent is the same as the total moles of Nb, Ta, Sb and M2, or stated alternatively, $\Sigma(Nb,Ta,Sb,Ca,Ba,Sr)$. Therefore, using Σ( . . . ), $\gamma=100\times(\Sigma(Mn)/\Sigma(Nb,Ta,Sb,Ca,Ba,Sr))$, and $\delta=100\times(\Sigma(Sc,In,Yb,Y,Nd,Eu,Gd,Dy,Sm,Ho,Er,Tb,Lu,La,Pr)/\Sigma(Nb,Ta,Sb,Ca,Ba,Sr))$.*

*Since there is Na in both the main and accessory constituents, the Na amount in the accessory constituents in proportion to the main component can be determined from the amount of total alkali metals, $\Sigma(K,Na,Li))/\Sigma(Nb,Ta,Sb,Ca,Ba,Sr)$, and subtracting the amount of Nb, Ta, and Sb, $\Sigma(Nb,Ta,Sb)/\Sigma(N,Ta,Sb,Ca,Ba,Sr)$. Consequently 2α can be represented by $100\times(\Sigma(K,Na,Li))/\Sigma(Nb,Ta,Sb,Ca,Ba,Sr)-\Sigma(Nb,Ta,Sb)/\Sigma(N,Ta,Sb,Ca,Ba,Sr))$, and $\alpha=50\times(\Sigma(K,Na,Li))/\Sigma(Nb,Ta,Sb,Ca,Ba,Sr)-\Sigma(Nb,Ta,Sb)/\Sigma(N,Ta,Sb,Ca,Ba,Sr))$.*

*As noted above, $\alpha+\beta$ mols of M4' with respect to 100 moles of the main constituent can be obtained by subtracting the amount of M2 (Ca, Ba, Sr) from that of M4 (Zr, Sn, Hf), and thus, using the $\Sigma(\ldots)$ system, is written as $\alpha+\beta=100\times(\Sigma(Zr,Sn,Hf)/\Sigma(Nb,Ta,Sb,Ca,Ba,Sr)-\Sigma(Ca,Ba,Sr)/\Sigma(Nb,Ta,Sb,Ca,Ba,Sr))$.*

In the case of substituting part of Nb with Sb in place of Ta, the amount is preferably adjusted so that the substitution molar quantity of Sb is 0.05 mol or less, that is, $0\leq d\leq 0.05$. This is because there is a possibility that a substitution molar quantity d of Sb greater than 0.05 will be excessive and lead to degradation of sinterability.

Next, a piezoelectric ceramic electronic component will be described which is manufactured with the use of the piezoelectric ceramic composition.

FIG. 1 is a cross-sectional view illustrating an embodiment of a laminated piezoelectric actuator as an example of piezoelectric ceramic electronic component according to the present invention. The laminated piezoelectric actuator includes a piezoelectric ceramic body 1, and external electrodes 2 (2a, 2b) composed of a conductive material such as Ag formed on both ends of the piezoelectric ceramic body 1. The ceramic body 1 is composed of piezoelectric ceramic layers composed of the piezoelectric ceramic composition according to the present invention and internal electrodes 3 (3a to 3g) formed from a conductive material containing Ni as its main constituent, which are stacked alternately and sintered.

In the laminated piezoelectric actuator, the internal electrodes 3a, 3c, 3e, and 3g each have one end electrically connected to one external electrode 2a, whereas the internal electrodes 3b, 3d, and 3f each have one end electrically connected to the other external electrode 2b. Thus, the laminated piezoelectric actuator is displaced by the longitudinal piezoelectric effect in the stack direction indicated by an arrow X, when a voltage is applied between the external electrode 2a and the external electrode 2b.

Next, a method for manufacturing the laminated piezoelectric actuator will be described in detail.

First, a compound containing K, a compound containing Nb, a compound containing an M4 element, and compound containing an M4' element are prepared as ceramic raw materials, and further, a compound containing an M2 element is prepared. In addition, a compound containing Na, a compound containing Li, and a compound containing Ta, a compound containing Sb, a compound containing Mn and a compound containing an M3 element are prepared. It is to be noted that the forms of the compounds may be any of oxides, carbonates, and hydroxides.

Next, the ceramic raw materials mentioned above are weighed in predetermined amounts so that the final product satisfies the general formula (A), and these weighed materials are then put into a grinding mill, such as a ball mill or a pot mill, with a grinding medium such as PSZ (partially-stabilized zirconia) balls therein, and wet ground sufficiently with a solvent such as ethanol, thereby providing a mixture.

Then, the mixture is dried, and subjected to synthesis calcination at a predetermined temperature (for example, 850° C. to 1000° C.) to obtain a calcined material.

Next, the calcined material thus obtained is disintegrated (ground), provided with an organic binder and a dispersant, and wet mixed in a ball mill with pure water or the like as a solvent to obtain a ceramic slurry. Then, a forming process is carried out with the use of a doctor blade method or the like to produce ceramic green sheets.

Figure 2:
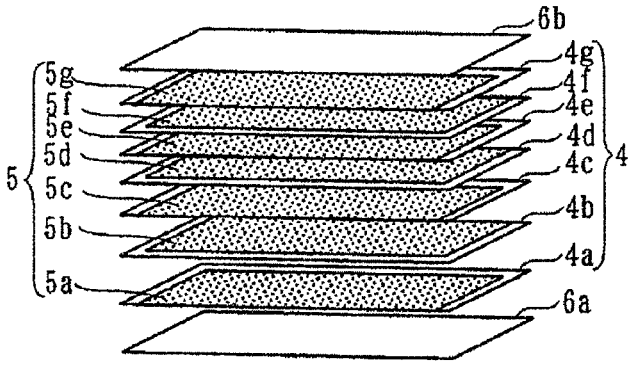
FIG. 2 is a perspective view of a ceramic green sheet obtained in the process of manufacturing the piezoelectric actuator.

A conductive paste for internal electrodes, which contains Ni as its main constituent, is used to carry out screen printing onto the ceramic green sheets 4 (4a to 4g) as shown in FIG. 2, thereby forming conductive layers 5 (5a to 5g) in a predetermined shape.

Next, the ceramic green sheets 4a to 4g with the conductive layers 5a to 5g formed thereon are stacked, sandwiched by ceramic green sheets 6a, 6b which have no conductive layers 5a to 5g on them, and pressure bonded, thereby producing a ceramic laminate of the conductive layers 5a to 5g and the ceramic green sheets 4a to 4g stacked alternately. This ceramic laminated is then cut into a predetermined size, housed in an alumina sheath and subjected to a binder removal treatment at a predetermined temperature (for example, 250° C. to 500° C.), and then fired at a predetermined temperature (for example, 1000° C. to 1160° C.) under a reducing atmosphere to form a dielectric ceramic body (ceramic sintered body) 1 with the internal electrodes 3a to 3g buried therein.

Figure 3:
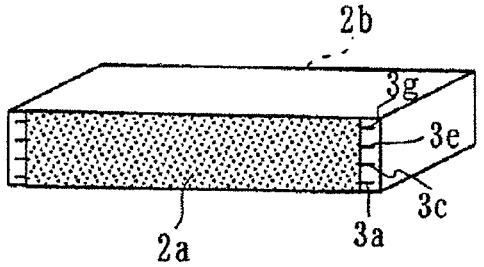
FIG. 3 is a perspective view of the piezoelectric actuator.

A conductive paste for external electrodes, which is composed of Ag, etc., is applied to both ends of the piezoelectric ceramic body 1, and subjected to a baking treatment at a predetermined temperature (for example, 750° C. to 850° C.) to form external electrodes 2a and 2b as shown in FIG. 3. A predetermined polarization treatment is then carried out thereby to produce a laminated piezoelectric actuator. It is to be noted that the external electrodes 2a and 2b may have favorable adhesion, and the external electrodes 2a and 2b may be formed, for example, by a thin film forming method such as a sputtering method or a vacuum deposition method.

As described above, the laminated dielectric actuator has the ceramic green sheets (ceramic layers) 4 formed from the piezoelectric ceramic composition and the internal electrodes containing Ni as their main constituent, and thus, a low-cost and highly-practical piezoelectric ceramic electronic component can be obtained which has a favorable piezoelectric properties, without causing defective polarization.

It is to be noted that the present invention is not limited to the embodiment described above. For example, the M2 element may include at least any one of Ca, Sr, and Ba, and the M2 element may include other bivalent elements, for example, Mg. More specifically, Mg is likely to be present as a solid solution in Ca, Sr, or Ba in crystal grains, but will not affect the property.

Next, examples of the present invention will be described specifically.

EXAMPLE 1

In Example 1, various types of samples which are different in the content molar quantity $2\alpha$ of Na, the total content molar quantity $(\alpha+\beta)$ of the M4' element, and the content molar quantity $\gamma$ of Mn were manufactured, and piezoelectric properties and Curie point Tc evaluated.

First, $K_2CO_3$, $Na_2CO_3$, $Li_2CO_3$, $Nb_2O_5$, $CaCO_3$, $SrCO_3$, $BaCO_3$, $ZrO_2$, $SnO_2$, $HfO_2$, $MnCO_3$, and $Yb_2O_3$ were prepared as ceramic raw materials.

Then, the materials were weighed so that the M2 element, the M4 element, the M4' element, $\alpha$, $\beta$, and $\gamma$provided compositions as shown in Table 1 in the general formula $[100\{0.98(K_{0.45}Na_{0.53}Li_{0.02})NbO_3-0.02M2M4O_3\}+2\alpha Na+(\alpha+\beta)M4'+\gamma Mn+0.5\,Yb]$.

Then, these weighed materials were put into a pot mill with PSZ balls therein, and wet mixed while rotating the pot mill with ethanol as a solvent for about 90 hours. The obtained mixtures were dried, and then subjected to calcination at a temperature of 900° C. to obtain calcined materials.

After disintegrating these calcined materials, the calcined material was put in a pot mill along with a binder, a dispersant, and pure water, as well as PSZ balls, wet mixed while rotating the pot mill, and then subjected to a forming process with the use of a doctor blade method to obtain ceramic green sheets each having a thickness of 120 μm.

A conductive paste for internal electrodes was prepared using Ni as a conductive material. This conductive paste for internal electrodes was used to form conductive layers in a predetermined pattern on the ceramic green sheets in accordance with a screen printing method. Then, a predetermined number of the ceramic green sheets with the conductive layers formed were stacked, sandwiched on the top and bottom by ceramic green sheets with no conductive layers formed thereon, and pressurized at a pressure of about $2.45\times10^7$ Pa for pressure bonding to produce a ceramic laminated compact.

The ceramic laminated compact was fired at a temperature of about 1100° C. for 2 hours in a reducing atmosphere with the equilibrium oxygen partial pressure for Ni/NiO adjusted to the reducing side by 0.5, thereby manufacturing a piezoelectric ceramic body (ceramic sintered body).

External electrodes composed of a Ni—Cu alloy were then formed by sputtering onto both principal surfaces of the piezoelectric ceramic body, and then, an electric field of 3.0 kV/mm was applied to the piezoelectric ceramic body in insulating oil at 80° C. for 30 minutes to carry out a polarization treatment.

After that, the piezoelectric ceramic bodies were cut into rectangular shapes of 15 mm in length, 3 mm in width, and 0.7 mm in thickness so that the external electrodes were located on the end surfaces, thereby manufacturing samples of sample number 1 to 22.

Next, the longitudinal electromechanical coupling coefficient $k_{31}$, piezoelectric constant $d_{33}$, and Curie point Tc were measured for these respective samples of sample numbers 1 to 22.

The longitudinal electromechanical coupling coefficient $k_{31}$ was obtained by a resonance-antiresonance method with the use of an impedance analyzer.

The piezoelectric constant $d_{33}$ was obtained from the amount of charge generated and the number of layers stacked when a $d_{33}$ meter was used to apply a force of 0.25 $N_{rms}$.

The Curie point Tc was obtained by measuring temperature characteristics of relative dielectric constant with the use of an impedance analyzer and calculating the maximum temperature for the relative dielectric constant.

Table 1 shows the constituent compositions and the measurement results for sample numbers 1 to 22. It is to be noted that the samples were considered non-defective products in the case of having a longitudinal electromechanical coupling coefficient $k_{31}$ of 10% or more, piezoelectric constant $d_{33}$ of 30 pC/N or more, and Curie point Tc of 150° C. or more.

TABLE 1

$100\{0.98(K_{0.45}Na_{0.53}Li_{0.02})NbO_3 - 0.02M2M4O_3\} + 2\alpha Na + (\alpha + \beta)M4' + \gamma Mn + 0.5Yb$

| Sample No. | M2 | M4 | M4' | α | β | α + β | γ | Electromechanical Coupling Coefficient $k_{31}$ (%) | Piezoelectric Constant $d_{33}$ (pC/N) | Curie point Tc (° C.) | Remarks |
|---|---|---|---|---|---|---|---|---|---|---|---|
| 1* | Ca | Zr | Zr | 0 | 5 | 5 | 5 | — | — | — | Defective Polarization |
| 2 | Ca | Zr | Zr | 1 | 4 | 5 | 5 | 24.1 | 183 | 230 | |
| 3 | Ca | Zr | Zr | 2.5 | 2.5 | 5 | 5 | 20 | 134 | 230 | — |
| 4 | Ca | Zr | Zr | 0.5 | 4.5 | 5 | 5 | 22.1 | 143 | 230 | — |
| 5 | Ca | Zr | Zr | 0.1 | 4.9 | 5 | 5 | 15.2 | 62 | 230 | — |
| 6* | Ca | Zr | Zr | 0.05 | 4.95 | 5 | 5 | — | — | — | Defective Polarization |
| 7* | Ca | Zr | Zr | 3 | 2 | 5 | 5 | 7.2 | 23 | 230 | — |
| 8 | Ca | Zr | Zr | 1 | 2 | 3 | 5 | 18.4 | 124 | 300 | — |
| 9 | Ca | Zr | Zr | 0.5 | 0.5 | 1 | 5 | 18.4 | 124 | 300 | — |
| 10* | Ca | Zr | Zr | 0.5 | 0.1 | 0.6 | 5 | — | — | — | Defective Polarization |
| 11 | Ca | Zr | Zr | 1 | 9 | 10 | 5 | 13.2 | 81 | 170 | — |
| 12* | Ca | Zr | Zr | 1 | 14 | 15 | 5 | 7.2 | 25 | 100 | — |
| 13 | Ca | Zr | Zr | 1 | 4 | 5 | 2 | 16.3 | 65 | 250 | — |
| 14** | Ca | Zr | Zr | 1 | 4 | 5 | 1 | 15.2 | 33 | 270 | Low Rate of Non-Defective Products |
| 15** | Ca | Zr | Zr | 1 | 4 | 5 | 0 | 11.1 | 30 | 280 | Low Rate of Non-Defective Products |
| 16 | Ca | Zr | Zr | 1 | 4 | 5 | 10 | 13.2 | 50 | 210 | — |
| 17* | Ca | Zr | Zr | 1 | 4 | 5 | 15 | 6.8 | 16 | 200 | — |
| 18 | Sr | Zr | Zr | 1 | 2 | 3 | 5 | 18.9 | 136 | 280 | — |
| 19 | Ba | Zr | Zr | 1 | 2 | 3 | 5 | 20.7 | 143 | 280 | — |
| 20 | Ca | Sn | Zr | 1 | 2 | 3 | 5 | 15.6 | 55 | 280 | — |
| 21 | Ca | Hf | Zr | 1 | 2 | 3 | 5 | 19 | 98 | 280 | — |
| 22 | Ca | Zr | Sn | 1 | 2 | 3 | 5 | 14.3 | 50 | 280 | — |

*outside the scope of the present invention

**outside preferred scope of the present invention

Sample numbers 1 to 17 are samples manufactured with Ca for the M2 element and Zr for the both M4 element and M4' element.

In sample number 1, a sample containing no Na therein (a is 0), exhibited defective polarization. This is supposed to be because no $Na_2ZrO_3$ was able to be formed in the process of the firing, and Ni in the conductive layers thus diffused to the ceramic green sheets during the firing, resulting in the segregation of Zr as the M4 element and in the formation of a segregated phase such as Ni, Mn, or Nb.

In the case of sample number 6, a sample containing Na but with a small content molar quantity 2α of 0.10 mol with respect to 100 mol of the main constituent (0.05 mol with respect to 50 mol of the main constituent), the formed $Na_2ZrO_3$ was not sufficient to reduce the segregated phase in the process of the firing, and as in the case of sample number 1, exhibited defective polarization.

The partial content molar quantity a of Zr in the case of sample number 7 was greater than the partial content molar quantity β thereof, causing a segregated phase of K, and resulting in the degraded piezoelectric properties of an electromechanical coupling coefficient $k_{31}$ of 7.2%, which is less than the desired 10%, and a piezoelectric constant $d_{33}$ of 23 pC/N, which is less than 30 pC/N.

In the case of sample number 10, there was defective polarization, because of the small total content molar quantity (α+β) of Zr of 0.6 mol with respect to 100 mol of the main constituent.

The excessive total content molar quantity (α+β) of Zr of 15 mol with respect to 100 mol of the main constituent in the case of sample number 12, caused the degraded piezoelectric property of an electromechanical coupling coefficient $k_{31}$ of 7.2%, which is less than 10%, and a piezoelectric constant $d_{33}$ of 25 pC/N, which is less than 30 pC/N.

In the case of sample number 17, a segregated phase of Mn was present, because of the excessive content molar quantity γ of Mn of 15 mol with respect to 100 mol of the main constituent. Thus, such a degraded piezoelectric properties were realized, namely an electromechanical coupling coefficient $k_{31}$ of 6.8%, which is less than 10%, and a piezoelectric constant $d_{33}$ of 16 pC/N, which is less than 30 pC/N.

In contrast to these samples, the partial content molar quantity α of Zr consumed in the reaction with Na is 0.1 mol or more, and the partial content molar quantity β of Zr is equivalent to the partial content molar quantity α or more, and the total content molar quantity (α+β) falls within the range of 1 to 10 mol in the case of sample numbers 2 to 5, 8 to 9, 11, and 13 to 16. In addition, the content molar quantity γ of Mn falls within the range of 0 to 10 mol, and these quantities all fill within the scope of the present invention. As a result, the use of Ni for the internal electrode material and the co-firing did not cause defective polarization, thereby providing favorable piezoelectric properties, namely an electromechanical coupling coefficient $k_{31}$ of 10% or more and a piezoelectric constant $d_{33}$ of 30 pC/N or more, and a Curie point Tc of 150° C. or more.

However, the content molar quantity γ of Mn less than 2 mol with respect to 100 mol of the main constituent in the case of sample numbers 14 and 15, resulted in only one to three of the 10 samples being able to be determined as non-defective products even though they had the same composition. Accordingly, it was found that the content molar quantity γ of Mn is preferably 2 mol or more with respect to 100 mol of the main constituent.

Sample numbers 18 to 22 are samples with different species of elements as the M2 element, the M4 element, and the M4' element, where the content molar quantity 2α of Na, the total content molar quantity (α+β) of the M4' element, and the content molar quantity γ of Mn are respectively 2 mol, 3 mol, and 5 mol with respect to 100 mol of the main constituent.

As is clear from sample numbers 18 to 22, no defective polarization was realized even in the case of using Sr or Ba in place of Ca as the M2 element (sample numbers 18 and 19) or using Sn or Hf in place of Zr as the M4 element and the M4' element (sample numbers 20 to 22). Thus, it was found that laminated piezoelectric ceramic electronic components can be obtained which have such favorable piezoelectric properties as an electromechanical coupling coefficient $k_{31}$ of 10% or more and a piezoelectric constant $d_{33}$ of 30 pC/N or more, and a Curie point Tc of 150° C. or more.

Next, WDX (wavelength dispersive X-ray analyzer) was used to carry out element mapping for each sample of sample numbers 1, 2, and 7.

Figure 4:
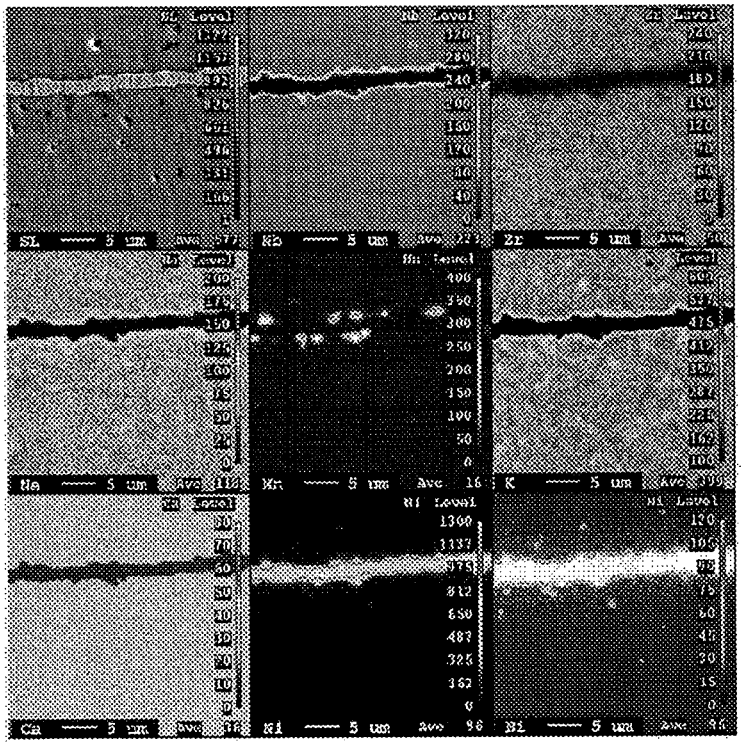
FIG. 4 is a mapping image for sample number 2.
Figure 5:
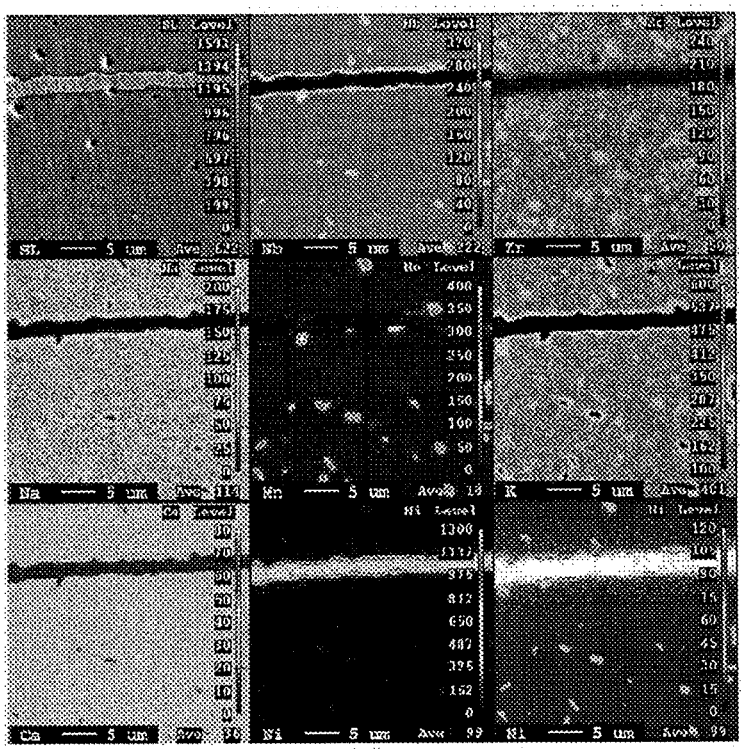
FIG. 5 is a mapping image for sample number 1.
Figure 6:
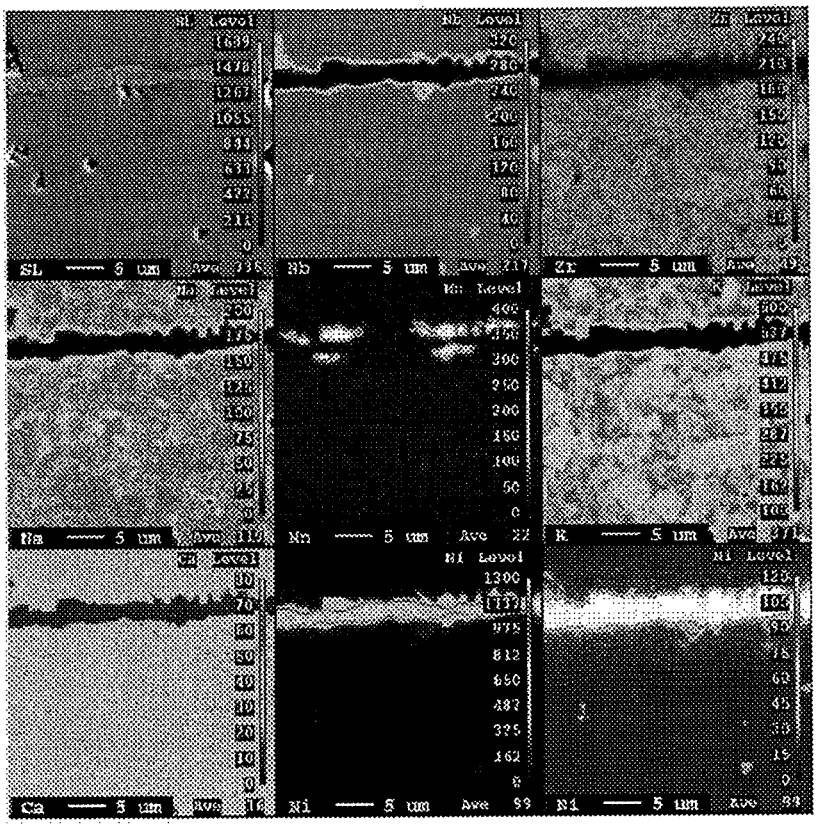
FIG. 6 is a mapping image for sample number 7.

FIG. 4 is a mapping image for sample number 2, FIG. 5 is a mapping image for sample number 1, and FIG. 6 is a mapping image for sample number 7.

Each of FIGS. 4 to 6 shows mapping images for each of a secondary electron image, Nb and Zr in the order of upper left, upper middle, and upper right, shows mapping images for each of Na, Mn, and K in the order of middle left, center, and middle right, and shows mapping images for each of Ca, Yb, and Ni in the order of lower left, lower middle, and lower right.

No $Na_2ZrO_3$ was formed in the process of the firing in the case of sample number 1, and thus as shown in FIG. 5, segregated phases are notably found for Nb (upper middle), Mn (center), and Ni (lower right). Zr (upper right) is also segregated.

Since the partial content molar quantity α of Zr is greater than the partial content molar quantity β thereof in the case of sample number 7, a segregated phase of K is formed at crystal grain boundaries, as shown in the middle right of FIG. 6.

In contrast to these samples, it was confirmed that no segregated phase is formed as shown in FIG. 4 in the case of sample number 2 which is within the scope of the present invention.

It was confirmed from FIGS. 4 to 6 and Table 1 that the segregated phases formed in the ceramic layers have influences on the polarization treatment and the piezoelectric properties. Furthermore, the compositional constituents according to the present invention provide a laminated piezoelectric ceramic electronic component which has favorable piezoelectric properties without causing defective polarization even in the case of using Ni for the internal electrode material and carrying out a co-firing.

EXAMPLE 2

In Example 2, various types of samples which differed in the composition of the main constituent were manufactured using Ca for the M2 element and Zr for both the M4 element and the M4' element, and evaluated for piezoelectric properties and Curie point Tc.

First, $K_2CO_3$, $Na_2CO_3$, $Li_2CO_3$, $Nb_2O_5$, $CaCO_3$, $ZrO_2$, $MnCO_3$, and $Yb_2O_3$ were prepared as ceramic raw materials.

Then, the materials were weighed so that a, b, c, x, β, and γ provided the compositions shown in Table 2 of the general formula $[100\{(1-x)(K_{1-a-b}Na_aLi_b)_m(Nb_{1-c}Ta_c)O_3-xCaZrO_3\}+2Na+(1+\beta)Zr+\gamma Mn+0.5\ Yb]$ where β is 5 or 2, and γ is 3.0 or 1.0.

Then, samples of sample numbers 31 to 42 were manufactured in accordance with the same method and procedure as in Example 1.

Next, the longitudinal electromechanical coupling coefficient $k_{31}$, piezoelectric constant $d_{33}$, and Curie point Tc were measured for the resulting sample numbers 31 to 42, in accordance with the same method as in [Example 1].

Table 2 shows the constituent compositions and the measurement results for sample numbers 31 to 42.

It is to be noted that the samples were determined as non-defective products in the case of having a longitudinal electromechanical coupling coefficient $k_{31}$ of 10% or more, piezoelectric constant $d_{33}$ of 30 pC/N or more, and Curie point Tc of 150° C. or more, as in the case of Example 1.

TABLE 2

| | $100+55(1-x)(K_{1-a-b}Na_aLi_b)(Nb_{1-c}Ta_c)O_3-xCaZrO_3\}+2Na+(1+\beta)Zr+\gamma Mn+0.5Yb$ | | | | | | | | | |
|---|---|---|---|---|---|---|---|---|---|---|
| Sample No. | a | b | c | x | β | γ | Electromechanical Coupling Coefficient $k_{31}$ (%) | Piezoelectric Constant $d_{33}$ (pC/N) | Curie point Tc (° C.) | Remarks |
| 31 | 0 | 0.02 | 0 | 0.02 | 2 | 5 | 11.3 | 53 | 320 | — |
| 32 | 0.9 | 0.02 | 0 | 0.02 | 2 | 5 | 12.2 | 50 | 320 | — |
| 33* | 0.95 | 0.02 | 0 | 0.02 | 2 | 5 | 5 | 24 | 320 | — |
| 34 | 0.54 | 0 | 0 | 0.02 | 2 | 5 | 18.5 | 118 | 300 | — |
| 35 | 0.54 | 0.1 | 0 | 0.02 | 2 | 5 | 13.4 | 106 | 300 | — |
| 36* | 0.54 | 0.2 | 0 | 0.02 | 2 | 5 | 4.6 | 21 | 300 | — |
| 37 | 0.54 | 0.02 | 0.3 | 0.01 | 2 | 5 | 14.4 | 78 | 180 | — |
| 38* | 0.54 | 0.02 | 0.4 | 0.01 | 2 | 5 | 5 | 23 | 120 | — |
| 39*** | 0.54 | 0.02 | 0 | 0 | 2 | 5 | 14 | 50 | 400 | Low Rate of Non-Defective Products |
| 40 | 0.54 | 0.02 | 0 | 0.001 | 2 | 5 | 14.2 | 68 | 370 | — |
| 41 | 0.54 | 0.02 | 0 | 0.06 | 1 | 2 | 11.4 | 80 | 160 | — |
| 42* | 0.54 | 0.02 | 0 | 0.1 | 1 | 2 | 5.2 | 28 | 100 | — |

*outside the scope of the present invention

***outside a preferred scope of the present invention

In the case of sample number 33, the substitution molar ratio a of Na was 0.95, and this excessive substitution amount of Na resulted in a low electromechanical coupling coefficient $k_{31}$ of 5%, which is less than 10%, and also a piezoelectric constant $d_{33}$ of 24 pC/N, which is less than 30 pC/N, thus failing to exhibit favorable piezoelectric properties.

It was found in the case of sample number 36 where the substitution molar ratio b of Li is 0.20, that the excessive substitution amount of Li resulted in a low electromechanical coupling coefficient $k_{31}$ of 4.6%, which is less than 10%, and also a piezoelectric constant $d_{33}$ of 21 pC/N, which is less than 30 pC/N, thus failing to obtain favorable piezoelectric properties.

In the case of sample number 38 (substitution molar Ta amount c of 0.4) the excessive substitution amount of Ta resulted in a low electromechanical coupling coefficient $k_{31}$ of 5%, which is less than 10%, thus failing to obtain favorable piezoelectric properties. In addition, it was found that the Curie point Tc of 120° C. is too low to use the sample as a piezoelectric body.

The solid solubility molar ratio x of $CaZrO_3$ is 0.1 in the case of sample number 42. It was found that the excessive solid solubility amount of $CaZrO_3$ resulted in a low electromechanical coupling coefficient $k_{31}$ of 5.2%, which is less than 10%, and also a piezoelectric constant $d_{33}$ of 28 pC/N, which is less than 30 pC/N, thus failing to obtain favorable piezoelectric properties. Furthermore, it was found that the low Curie point Tc of 100° C. is not suitable for use as a piezoelectric body.

In contrast to these samples, sample numbers 31, 32, 34, 35, 37, and 39 to 41, had a, b, c, and x values which were respectively $0 \le x \le 0.06$, $0 \le a \le 0.9$, $0 \le b \le 0.1$, and $0 \le c \le 0.3$, and these quantities all fill within the scope of the present invention. Thus, the use of Ni for the internal electrode material and co-firing did not cause defective polarization, and provided such a favorable piezoelectric property as an electromechanical coupling coefficient $k_{31}$ of 10% or more and a piezoelectric constant $d_{33}$ of 30 pC/N or more, and allowing for a Curie point Tc of 150° C. or more.

However, the main constituent contained no $CaZrO_3$ in the case of sample number 39, and only one to three of the 16 samples were determined as non-defective products. Accordingly, $CaZrO_3$ is preferably made present as a solid solution in the main constituent from the viewpoint of product yield, and $CaZrO_3$ is preferably made present as a solid solution so that the solid solubility molar ratio x in the main constituent is 0.001 or more.

EXAMPLE 3

In Example 3, samples different in the content of a specific rare earth element M3 (M3 element) and samples different in the element species of the M3 element were manufactured with Ca for the M2 element and Zr for both the M4 element and the M4' element, and evaluated for properties.

First, $K_2CO_3$, $Na_2CO_3$, $Li_2CO_3$, $Nb_2O_5$, $CaCO_3$, $ZrO_2$, $MnCO_3$, $Yb_2O_3$, $SC_2O_3$, $In_2O_3$, $Y_2O_3$, $Nd_2O_3$, $Eu_2O_3$, $Gd_2O_3$, $Dy_2O_3$, $Sm_2O_3$, $HO_2O_3$, $Er_2O_3$, $Tb_2O_3$, $Lu_2O_3$, $La_2O_3$, and, $Pr_2O_3$ were prepares as ceramic raw materials. Then, the materials were weighed so that α, β, δ, and M3 provided compositions as shown in Table 3 in the general formula $[100\{0.98(K_{0.45}Na_{0.53}Li_{0.02})NbO_3-0.02CaZrO_3\}+2\alpha Na+(\alpha+\beta)Zr+5\ Mn+\delta M3]$.

Samples of sample numbers 51 to 72 were manufactured in accordance with the same method and procedure as in Example 1.

The longitudinal electromechanical coupling coefficient $k_{31}$, piezoelectric constant $d_{33}$, and Curie point Tc were measured for these respective samples of sample numbers 51 to 72, in accordance with the same method as in Example 1.

Table 3 shows the constituent compositions and the measurement results for sample numbers 51 to 72.

Here, samples were determined as non-defective products in the case of the longitudinal electromechanical coupling coefficient $k_{31}$ being 10% or more, the piezoelectric constant $d_{33}$ being 30 pC/N or more, and the Curie point To being 150° C. or more, as in the case of Example 1.

TABLE 3

| | $100\{0.98(K_{0.45}Na_{0.53}Li_{0.02})NbO_3 \cdot 0.02CaZrO_3\} + 2\alpha Na + (\alpha + \beta)Zr + 5Mn + \delta M3$ | | | | | | | | |
|---|---|---|---|---|---|---|---|---|---|
| Sample No. | α | β | α + β | δ | M3 | Electromechanical Coupling Coefficient $k_{31}$ (%) | Piezoelectric Constant $d_{33}$ (pC/N) | Curie point Tc (° C.) | Remarks |
| 51** | 0 | 3 | 3 | 0 | Yb | — | — | — | Defective Polarization |
| 52**** | 1 | 2 | 3 | 0 | Yb | 17.1 | 109 | 240 | Warpage |
| 53**** | 2.5 | 2.5 | 5 | 0 | Yb | 20 | 66 | 300 | Warpage |
| 54 | 1 | 4 | 5 | 0.1 | Yb | 18.1 | 117 | 190 | — |
| 55 | 1 | 4 | 5 | 0.5 | Yb | 18.4 | 120 | 190 | — |
| 56 | 1 | 4 | 5 | 1.0 | Yb | 17.2 | 103 | 190 | — |
| 57 | 1 | 4 | 5 | 5.0 | Yb | 16.2 | 100 | 180 | — |
| 58**** | 1 | 4 | 5 | 10.0 | Yb | — | — | — | Defective Sintering |
| 59 | 1 | 4 | 5 | 0.5 | Sc | 17.5 | 100 | 180 | Color Points |
| 60 | 1 | 4 | 5 | 0.5 | In | 18.3 | 116 | 180 | Color Points |
| 61 | 1 | 4 | 5 | 0.5 | Y | 18.6 | 124 | 190 | — |
| 62 | 1 | 4 | 5 | 0.5 | Nd | 18.5 | 121 | 190 | — |
| 63 | 1 | 4 | 5 | 0.5 | Eu | 18.3 | 118 | 190 | — |
| 64 | 1 | 4 | 5 | 0.5 | Gd | 17.8 | 103 | 190 | — |
| 65 | 1 | 4 | 5 | 0.5 | Dy | 18.7 | 122 | 190 | — |
| 66 | 1 | 4 | 5 | 0.5 | Sm | 17.2 | 102 | 180 | — |
| 67 | 1 | 4 | 5 | 0.5 | Ho | 18.4 | 115 | 190 | — |
| 68 | 1 | 4 | 5 | 0.5 | Er | 18.2 | 110 | 190 | — |
| 69 | 1 | 4 | 5 | 0.5 | Tb | 18.3 | 114 | 190 | — |
| 70 | 1 | 4 | 5 | 0.5 | Lu | 17.8 | 110 | 190 | — |
| 71 | 1 | 4 | 5 | 0.5 | La | 16.3 | 105 | 180 | Color Points |
| 72 | 1 | 4 | 5 | 0.5 | Pr | 17.4 | 108 | 190 | — |

*outside the scope of the present invention

****outside a preferred scope of the present invention

In the case of sample number 51, a sample containing no Na therein with α of 0, failed to form $Na_2ZrO_3$ in the process of the firing. For this reason, the use of Ni for the internal electrode material and co-firing formed a segregated phase such as Ni, Mn, or Nb, thereby causing defective polarization.

In contrast to this sample, the partial content molar quantity α of Zr consumed in the reaction with Na is 1 to 2.5, the partial content molar quantity β of Zr is greater than the partial content molar quantity α thereof, and the total content molar quantity (α+β) of Zr is 3 to 5 mol in the case of sample numbers 52 to 57 and 59 to 72, further, a M3 element is used which is specified in the present invention. Thus, it was found that the use of Ni for the internal electrode material and co-firing resulted in no defective polarization, thereby allowing for the achievement of a laminated piezoelectric ceramic electronic component which has such favorable piezoelectric properties as an electromechanical coupling coefficient $k_{31}$ of 10% or more, a piezoelectric constant $d_{33}$ of 30 pC/N or more, and has a Curie point Tc of 150° C. or more.

However, when the M3 element (Yb) was excessively present at 10 mol, greater than 5.0 mol, with respect to 100 mol of the main constituent, and as is clear from sample number 58 sufficient sintering was not able to be carried out, thus resulting in a sample with defective sintering. Accordingly, it was found that in the case of containing the M3 element, the M3 element is preferably 5.0 mol or less with respect to 100 mol of the main constituent.

Sample numbers 52 and 53 containing no M3 element, and the ceramic sintered bodies exhibited warpage. Accordingly, while a favorable piezoelectric property and a Curie point Tc of 150° C. or more can be achieved even the M3 element, it was confirmed that it is preferable to contain the M3 element within the range of 0.1 mol to 5.0 mol with respect to 100 mol of the main constituent as shown in the case of sample numbers 54 to 57, in order to prevent the ceramic sintered bodies from having warpage.

In the case of using Sc, In, or La among the M3 elements, the ceramic sintered body had no warpage, but there were color points. This is supposed to be because Sc, In, and La are slightly inferior in sinterability as compared with the other M3 elements. There is a possibility that the color points will lead to degraded reliability of piezoelectric ceramic electronic components. Accordingly, it is more preferable to use, as the specific rare earth element M3, Yb, Y, Nd, Eu, Gd, Dy, Sm, Ho, Er, Tb, Lu, and Pr excluding Sc, In, and La.

EXAMPLE 4

In Example 4, samples in which part of Nb is substituted with Sb rather than Ta were manufactured with Ca for the M2 element, Zr for both the M4 element and the M4' element, and further Yb for the M3 element, and evaluated for properties.

First, $K_2CO_3$, $Na_2CO_3$, $Li_2CO_3$, $Nb_2O_5$, $Sb_2O_5$, $CaCO_3$, $ZrO_2$, $MnCO_3$, and $Yb_2O_3$ were prepared as ceramic raw materials. Then, the materials were weighed so that d provided compositions as shown in Table 4 having the general formula $[100\{0.98(K_{0.45}Na_{0.53}Li_{0.02})(Nb_{1-d}Sb_d)O_3-0.02CaZrO_3\}+2Na+3Zr+5\ Mn+0.5\ Yb]$.

Then, samples of sample numbers 81 to 83 were manufactured in accordance with the same method and procedure as in Example 1.

Next, the longitudinal electromechanical coupling coefficient $k_{31}$, piezoelectric constant $d_{33}$, and Curie point Tc were measured for these respective samples of sample numbers 81 to 83, in accordance with the same method as in Example 1.

Table 4 shows the constituent compositions and the measurement results for sample numbers 81 to 83.

As in the case of Example 1, samples were determined as non-defective products when having a longitudinal electromechanical coupling coefficient $k_{31}$ of 10% or more, piezoelectric constant $d_{33}$ of 30 pC/N or more, and Curie point Tc of 150° C. or more.

TABLE 4

| Sample No. | d | Electromechanical Coupling Coefficient $k_{31}$ (%) | Piezoelectric Constant $d_{33}$ (pC/N) | Curie point Tc (° C.) | Remarks |
|---|---|---|---|---|---|
| | $100\{0.98(K_{0.45}Na_{0.53}Li_{0.02})(Nb_{1-d}Sb_d)(O_3 - 0.02CaZrO_3\} + 2Na + 3Zr + 5Mn + 0.5Yb$ | | | | |
| 81 | 0.01 | 15.3 | 70 | 240 | — |
| 82 | 0.05 | 14.3 | 83 | 150 | — |
| 83***** | 0.10 | — | — | — | Defective Sintering |

*****outside preferred scope of the present invention

In the case of sample number 83, having a substitution molar amount d of Sb is 0.10, it was found the excessive substitution amount of Sb caused defective sintering, thus failing to obtain desired piezoelectric properties.

In contrast to sample 83, the substitution molar amount d of Sb is 0.05 or less in the case of sample numbers 81 and 82, and thus it was found that the use of Ni for the internal electrode material and co-firing caused no defective polarization or defective sintering, thereby allowing for the achievement of a laminated piezoelectric ceramic electronic component which has such favorable piezoelectric properties as an electromechanical coupling coefficient $k_{31}$ of 10% or more and a piezoelectric constant $d_{33}$ of 30 pC/N or more, and has a Curie point Tc of 150° C. or more.

INDUSTRIAL APPLICABILITY

The use of Ni for the internal electrode material and the co-firing cause no defective polarization, thereby allowing for the achievement of a lead-free piezoelectric ceramic composition which has a favorable piezoelectric property.

DESCRIPTION OF REFERENCE SYMBOLS

1 piezoelectric ceramic body
2a, 2b external electrode
3a to 3g internal electrode

The invention claimed is:

1. A piezoelectric ceramic composition comprising a main constituent represented by the compositional formula $$\{(1-x)(K_{1-a-b}Na_aLi_b)(Nb_{1-c-d}Ta_cSb_d)O_3\}-xM2M4O_3\}$$

wherein M2 is at least one member of the group consisting of Ca, Ba, and Sr, M4 is at least one member of the group consisting of Zr, Sn, and Hf, $0 \le x \le 0.06$, $0 \le a \le 0.9$, $0 \le b \le 0.1$, $0 \le c \le 0.3$, and $0 \le d \le 0.05$, and as accessory constituents, $2\alpha$ mol of Na, $(\alpha+\beta)$ mol of M4', $\gamma$ mol of Mn and $\delta$ mol of M3, with respect to 100 mol of the main constituent, wherein M4' is at least one member of the group consisting of Zr, Sn, and Hf, M3 is at least one member selected from the group of Sc, In, Yb, Y, Nd, Eu, Gd, Dy, Sin, Ho, Er, Tb, Lu, La, and Pr, $0.1 \le \alpha \le \beta$, $1 \le \alpha+\beta \le 10$, $0 \le \gamma \le 10$, and $0 \le \delta \le 5$.

2. The piezoelectric ceramic composition according to claim 1, wherein $2 \le \gamma \le 10$.

3. The piezoelectric ceramic composition according to claim 2, wherein $0.001 \le x \le 0.06$.

4. The piezoelectric ceramic composition according to claim 3, wherein $0<d$.

5. The piezoelectric ceramic composition according to claim 4, wherein $0<\delta$.

6. The piezoelectric ceramic composition according to claim 5, wherein $0.1 \le \delta$.

7. The piezoelectric ceramic composition according to claim 6, wherein M3 is at least one member selected from the group of Yb, Y, Nd, Eu, Gd, Dy, Sm, Ho, Er, Tb, Lu, and Pr.

8. The piezoelectric ceramic composition according to claim 1, wherein $0.001 \le x \le 0.06$.

9. The piezoelectric ceramic composition according to claim 1, wherein $0<d$.

10. The piezoelectric ceramic composition according to claim 1, wherein $0<\delta$.

11. A piezoelectric ceramic electronic component comprising a sintered piezoelectric ceramic body comprising internal electrodes and piezoelectric ceramic layers stacked alternately; and at least two external electrodes on a surface of the piezoelectric ceramic body, wherein the piezoelectric ceramic layers comprise the piezoelectric ceramic composition according to claim 9.

12. The piezoelectric ceramic electronic component according to claim 11, wherein the internal electrodes comprise Ni as their main constituent.

13. A piezoelectric ceramic electronic component comprising a sintered piezoelectric ceramic body comprising internal electrodes and piezoelectric ceramic layers stacked alternately; and at least two external electrodes on a surface of the piezoelectric ceramic body, wherein the piezoelectric ceramic layers comprise the piezoelectric ceramic composition according to claim 8.

14. The piezoelectric ceramic electronic component according to claim 13, wherein the internal electrodes comprise Ni as their main constituent.

15. A piezoelectric ceramic electronic component comprising a sintered piezoelectric ceramic body comprising internal electrodes and piezoelectric ceramic layers stacked alternately; and at least two external electrodes on a surface of the piezoelectric ceramic body, wherein the piezoelectric ceramic layers comprise the piezoelectric ceramic composition according to claim 7.

16. The piezoelectric ceramic electronic component according to claim 15, wherein the internal electrodes comprise Ni as their main constituent.

17. A piezoelectric ceramic electronic component comprising a sintered piezoelectric ceramic body comprising internal electrodes and piezoelectric ceramic layers stacked alternately; and at least two external electrodes on a surface of the piezoelectric ceramic body, wherein the piezoelectric ceramic layers comprise the piezoelectric ceramic composition according to claim 2.

18. The piezoelectric ceramic electronic component according to claim 17, wherein the internal electrodes comprise Ni as their main constituent.

19. A piezoelectric ceramic electronic component comprising a sintered piezoelectric ceramic body comprising internal electrodes and piezoelectric ceramic layers stacked alternately; and at least two external electrodes on a surface of the piezoelectric ceramic body, wherein the piezoelectric ceramic layers comprise the piezoelectric ceramic composition according to claim 1.

20. The piezoelectric ceramic electronic component according to claim 19, wherein the internal electrodes comprise Ni as their main constituent.

*21. A piezoelectric ceramic electronic component comprising a sintered piezoelectric ceramic body comprising internal electrodes and piezoelectric ceramic layers stacked alternately; and at least two external electrodes on a surface of the piezoelectric ceramic body,*

*wherein the piezoelectric ceramic layers contain a main constituent and an accessory constituent, the accessory constituent contains 2α mol of Na with respect to 100 mol of the main constituent, and wherein molar content of respective elements constituting piezoelectric ceramic layers are represented by:*

$x=\Sigma(Ca,Ba,Sr)/(\Sigma(Nb,Ta,Sb,Ca,Ba,Sr)$, $a=1-(\Sigma(Li)/(\Sigma(Nb,Ta,Sb)-(\Sigma(K)/(\Sigma(Nb,Ta,Sb))$, $b=\Sigma(Li)/\Sigma(Nb,Ta,Sb)$, $c=\Sigma(Ta)/\Sigma(Nb,Ta,Sb)$, $d=\Sigma(Sb)/\Sigma(Nb,Ta,Sb)$, $\alpha=50\times(\Sigma(K,Na,Li))/\Sigma(Nb,Ta,Sb,Ca,Ba,Sr)-\Sigma(Nb,Ta,Sb)/\Sigma(Nb,Ta,Sb,Ca,Ba,Sr))$, $\alpha+\beta=100\times(\Sigma(Zr,Sn,Hf)/\Sigma(Nb,Ta,Sb,Ca,Ba,Sr)-\Sigma(Ca,Ba,Sr)/\Sigma(Nb,Ta,Sb,Ca,Ba,Sr))$, $\gamma=100\times(\Sigma(Mn)/\Sigma(Nb,Ta,Sb,Ca,Ba,Sr))$, *and*

$\delta=100\times(\Sigma(Sc,In,Yb,Y,Nd,Eu,Gd,Dy,Sm,Ho,Er,Tb,Lu,La,Pr)/\Sigma(Nb,Ta,Sb,Ca,Ba,Sr))$,

*in which* $\Sigma(\ldots)$ *indicates the total of moles of the elements within the brackets ( ),*

$0.001\leq x\leq 0.06$, $0\leq a\leq 0.9$, $0\leq b\leq 0.1$, $0\leq c\leq 0.3$, $0\leq d\leq 0.05$, $0.1\leq\alpha\leq\beta$, $1\leq\alpha+\beta\leq 10$, *and*

$0\leq\gamma\leq 10$, *and*

$0\leq\delta\leq 5$.

*22. The piezoelectric ceramic electronic component according to claim 21, wherein the internal electrodes comprise Ni as their main constituent.*

* * * * *